(12) United States Patent
Gerster et al.

(10) Patent No.: US 9,680,043 B2
(45) Date of Patent: Jun. 13, 2017

(54) PHOTOVOLTAIC MODULE WITH ADJUSTABLE HEIGHT CONCENTRATOR

(71) Applicant: Saint-Augustin Canada Electric Inc., Saint-Augustin (CA)

(72) Inventors: Eckart Gerster, Freiburg (DE); Jacob Stor, Freiburg (DE); Johannes Wullner, Freiburg (DE)

(73) Assignee: Saint-Augustin Canada Electric Inc., Saint-Augustin, QC ( * ) Notice: Subject to any disclaimer, the term of this patent is extended or adjusted under 35 U.S.C. 154(b) by 199 days.

(21) Appl. No.: 14/390,341

(22) PCT Filed: Apr. 2, 2013

(86) PCT No.: PCT/EP2013/056944
§ 371 (c)(1),
(2) Date: Oct. 2, 2014

(87) PCT Pub. No.: WO2013/150031
PCT Pub. Date: Oct. 10, 2013

(65) Prior Publication Data
US 2015/0059851 A1 Mar. 5, 2015

(30) Foreign Application Priority Data
Apr. 3, 2012 (FR) ..................... 12 53056

(51) Int. Cl.
*H01L 31/044* (2014.01)
*H01L 31/054* (2014.01)
(Continued)

(52) U.S. Cl.
CPC .......... *H01L 31/0543* (2014.12); *H02S 20/30* (2014.12); *H02S 20/32* (2014.12); *Y02E 10/52* (2013.01)

(58) Field of Classification Search
CPC ....... H01L 31/00–31/078; Y02E 10/50–10/60; F24J 2/00–2/407;
(Continued)

(56) References Cited

U.S. PATENT DOCUMENTS

| | | | |
|---|---|---|---|
| 2008/0163922 A1* | 7/2008 | Horne ........................ | F24J 2/18 136/248 |
| 2011/0114180 A1* | 5/2011 | Steinblatt ................... | F24J 2/38 136/259 |

FOREIGN PATENT DOCUMENTS

| | | |
|---|---|---|
| JP | 07193267 A | 7/1995 |
| WO | 2007014716 A1 | 2/2007 |
| WO | 2007093422 A1 | 8/2007 |

OTHER PUBLICATIONS

International Search Report for International Application No. PCT/EP2013/056944 dated Jun. 7, 2013, 3 pages.
(Continued)

*Primary Examiner* — Bach Dinh
(74) *Attorney, Agent, or Firm* — TraskBritt (57) ABSTRACT

The invention relates to a photovoltaic concentrator module comprising at least one lens and at least one photovoltaic cell, further comprising a distance adjustment means configured to adjust the distance between the at least one lens and the at least one photovoltaic cell. Using the distance adjustment means, the cell and the lens can be kept at a desired distance, e.g., the focal distance. The distance adjustment means can be a pressure varying means. The invention further relates to a photovoltaic concentrator array comprising a plurality of photovoltaic concentrator modules and to a method for improving the energy conversion efficiency of a photovoltaic concentrator module.

20 Claims, 5 Drawing Sheets

(51) Int. Cl.
*H02S 20/30* (2014.01)
*H02S 20/32* (2014.01)

(58) Field of Classification Search
CPC ......... H02S 10/00–10/40; H02S 20/00–20/32;
H02S 30/00–30/20; H02S 40/00–40/40;
H02S 50/00–50/15; H02S 99/00
USPC .................................................. 136/243–265
See application file for complete search history.

(56) References Cited

OTHER PUBLICATIONS

Written Opinion of the International Search Authority for International Application No. PCT/EP2013/056944 dated Jun. 7, 2013, 6 pages.
International Preliminary Report on Patentability for International Application No. PCT/EP2013/056944 dated Oct. 7, 2014, 6 pages.

* cited by examiner

PHOTOVOLTAIC MODULE WITH ADJUSTABLE HEIGHT CONCENTRATOR

CROSS-REFERENCE TO RELATED APPLICATIONS

This application is a national phase entry under 35 U.S.C. §371 of International Patent Application PCT/EP2013/056944, filed Apr. 2, 2013, designating the United States of America and published in English as International Patent Publication WO 2013/150031 A1 on Oct. 10, 2013, which claims the benefit under Article 8 of the Patent Cooperation Treaty and under 35 U.S.C. §119(e) to French Patent Application Serial No. 1253056, filed Apr. 3, 2012, the disclosure of each of which is hereby incorporated herein in its entirety by this reference.

TECHNICAL FIELD

The present invention relates to a concentrated photovoltaic (CPV) module, in particular, to a CPV module that improves the energy conversion efficiency and finally the energy yield. The invention also relates to a CPV array comprising a plurality of such CPV modules, and to a method for improving the energy conversion efficiency and finally the energy yield of a CPV module.

BACKGROUND

In concentrated photovoltaic (CPV) modules, the incident light, in particular, the solar radiation, is concentrated on a photovoltaic cell by an optical system comprising, e.g., a mirror or a lens, such as a Fresnel lens or a spherical lens. For this purpose, the cell must be positioned at the focus of the lens. Such CPV modules are used, alone or combined in arrays, e.g., for generating current in photovoltaic power plants and can be mounted on tracking units in order to be optimally orientated toward the incident light, in particular, following the brightest region in the sky. Commonly, a CPV module or a CPV array comprises a lens plate and a receiver plate that is holding the solar cells. As described in WO 2007/093422 A1 and WO 2007/014716 A1, both parts are packed together by a frame that stabilizes the module mechanically and provides a housing to protect the inner module parts toward the environment.

It has been observed that the energy conversion efficiency of such systems is not constant over time and under different environmental conditions. Thus, there is a need for solutions to improve the overall energy conversion efficiency of CPV modules.

BRIEF SUMMARY

The object of the invention is achieved with a photovoltaic concentrator (CPV) module comprising at least one lens and at least one photovoltaic cell, and further comprising a distance adjustment means configured to adjust the distance between the at least one lens and the at least one photovoltaic cell.

The refractive index of most materials, including air, varies with temperature. In particular, the refractive index of a lens can vary with temperature, causing the power of the lens to vary as well, which in turn changes the system focus depending on the temperature. In the case of concentrated photovoltaics, Fresnel lenses are commonly used because they require less material compared to lenses made from bulk material, but other lenses may alternatively be used as long as they allow for a cheap production cost and low weight of the final system. The materials commonly used for realizing lenses in CPV modules are polymeric materials, which show a significant change in refractive index depending on the material temperature. Moreover, the volume of such polymeric materials is also temperature dependent. As a consequence, the focal length of a lens, in particular, a Fresnel lens, varies with temperature. This has the effect of degrading the energy conversion efficiency of the CPV module or array.

Further factors such as the daily and/or yearly variability of the solar spectrum, the atmospheric extinction and the chromatic aberration of the lens also contribute to changing the system focus because the incident radiation does not always optimally match the spectral response of the cell. As a consequence, the energy conversion efficiency of state-of-the-art CPV modules is not optimal.

The inventive CPV module has the advantage of allowing the distance between the lens and the solar cell to be intentionally modified. For instance, in the case of CPV modules comprising Fresnel lenses, e.g., made of a polymeric material, the inventive CPV module allows for a compensation for temperature-related changes in the distance between the lens and the CPV cell. Furthermore, the active control of the relative distance between lens and CPV cell in the inventive CPV module also reduces the dependency of the module performance on the solar spectrum variability. A passive control would also be possible if a suitable material and design were selected. Thus, the lens and the solar cell can be optimally positioned with respect to each other at any moment in order to compensate for undesired distance variations, thereby improving the energy conversion efficiency of the solar module.

Preferably, the distance adjustment means can be configured to adjust the distance such that the at least one photovoltaic cell is in focus with respect to its lens. An advantage of this preferred variant is that the inventive CPV module allows the energy conversion efficiency to be optimized by keeping the CPV cell at the focal point of the lens, even when the focal distance changes due to temperature and/or incident light spectral variations. In the case of chromatic aberrations, this allows the distance between the lens and the solar cell to be adjusted so that the average focal distance corresponding to the optimal wavelength range of the response of the solar cell material is matched, thus optimizing the energy conversion of the CPV module.

In a preferred variant, the distance adjustment means can be configured to adjust the distance by varying pressure. Given that CPV modules' geometry is commonly comparable to a box and the materials composing the module, in particular, the lens plate holding and comprising the at least one lens, show some kind of elasticity, the effective module height, hence the distance between the lens and the CPV cell, can be actively adjusted using pressure changes, in particular, by increasing or decreasing the pressure inside the module or inside module components. For example, compressed air could be used for this purpose. Even further preferred, dry air could be used in order to effectively avoid potential condensation of air humidity inside the module. For instance, dry air could be pumped into the module cavity and released periodically. A further possibility for adjusting the distance and/or the pressure inside the CPV module could involve a cell mounted on a plate moved toward or away from the lens by a piezoelectric actuator or a mechanical actuator.

Another further possibility could be to change the refractive index inside the CPV cell with different gases. This, however, would only have a minor effect on the focal length compared to an adjustment of the relative position between the lens and the cell. A passive adjustment of the distance is also possible, depending on the choice of material and design, for instance, by using bimetals, a thermal expansion of the gas-filled cavity, or a construction using thermal expansion of polymeric or other solid materials.

Advantageously, the at least one lens and the at least one photovoltaic cell can be arranged on or in opposing surfaces of a pressure-tight main housing. Solar cells usually need to be isolated from the environment. Hence, CPV modules are commonly designed with an isolating housing or a sealing that prevents dirt and/or humidity to enter the space between the lens and the cell. Furthermore, CPV modules are often used in geographic locations with an important solar illumination, with the inconvenience that these regions often have large daily and/or yearly variations in ambient temperature. CPV systems cannot work optimally in these environments, since the optimal focus of the lens on the solar cell can only be achieved for a small temperature range. Using a housing that is pressure tight, with the lens and the cell facing each other and arranged on or in opposing surfaces of the housing, has the advantage that a wide range of distance adjustments becomes accessible because both components, in particular, the whole module housing, can be moved, respectively reshaped, by changing the pressure inside the module main housing. For example, the CPV module main housing can be "inflated" or "deflated" so that the average distance between the lens and the cell is increased or decreased, respectively. Thus, large temperature variations can be compensated with this variant of the inventive CPV module.

In another variant of a preferred embodiment, the at least one photovoltaic cell can be arranged on or in a surface of a pressure-tight secondary housing provided underneath the cell. This has the advantage of adjusting the position of the CPV cell relatively to the lens by moving only the cell. For example, the CPV cell can be provided on an air or a fluid cushion, on or in any surface of a pressure-tight housing provided underneath the cell, in particular, on or in a pressure-tight housing attached to or comprised with the heat sink components of the CPV cell. This variant can also be combined with a pressure-tight main housing in order to complement the distance adjustment by pressure variation inside the main housing with a secondary adjustment, allowing compensation for even larger temperature variations.

Preferably, the lens and/or the main housing and/or the secondary housing can be at least partially made of a flexible material. Since the module geometry is commonly comparable to a box and the flexibility or elasticity of the materials it is made of can be known as a function of temperature, pressure variations can be applied accordingly in order to adjust the varying distance between a lens and a corresponding cell of a CPV module by changing the shape of the main housing and/or a secondary housing. Advantageously, the lateral dimensions of such a module can thus also be adjusted by varying pressure, also allowing compensation for temperature-related lateral shifts of focal points or of the geometrical center of the lenses. The housings can be made of, e.g., metal materials, and/or plastic or polymeric materials, and/or glass, and/or acrylic, and/or PLEXIGLAS®, and/or the like. Thus, the construction materials can be chosen such that their flexibility is adapted to the scale of temperature variations of the geographic location of an inventive CPV module. This has the advantage of improving the module efficiency over broad temperature ranges.

Preferably, the CPV module can further comprise a temperature-sensing means and the distance adjustment means can be further configured to adjust the pressure inside the main housing or the secondary housing as a function of the temperature sensed by the temperature-sensing means. The materials used for the CPV module, in particular, for the lens and/or a pressure-tight main housing, can be optimized depending on their properties against temperature variations. In particular, the relation between temperature variations and refractive index variations of the lens material and/or of the air can be calibrated such that focal distance corrections are applied optimally. In particular, focal length changes due to temperature variations can be calibrated continuously, or periodically, or from time to time, in order to improve the efficiency of the module at any moment, with the advantage that the distance corrections, in particular, the pressure adjustments inside the main housing and/or a secondary housing of the CPV module can be automated for a given temperature range.

Advantageously, the CPV module can further comprise a means for determining the energy conversion efficiency of the module, and the distance adjustment means can be further configured to adjust the distance such that the conversion efficiency of the module is at least equal or higher than a predetermined value. Regardless of actively correcting the focal distance for temperature variations, the distance between the lens and the cell can thus be optimized at any moment in order to maximize the energy output of the module via a feedback on the determined module efficiency. The determined efficiency can be compared to a predetermined value, which can be, e.g., a fixed value depending on the performance of the CPV module and/or an array on which the module is arranged, or a local maximum obtained, e.g., by scanning a range of pressures and/or relative distances between the lens and the solar cell.

The object of the invention is also achieved with a photovoltaic concentrator array comprising a plurality of inventive photovoltaic concentrator modules. Advantageously, a plurality of inventive CPV modules can be combined, forming an array or a solar panel yielding optimized energy outputs for a wide range of temperature variations and/or variations in the incident light spectrum.

In a preferred variant, a plurality of, in particular, all, photovoltaic concentrator modules can share the same pressure-tight housing. For the variant of the inventive CPV modules where the distance between a lens and its corresponding cell is controlled via pressure changes inside a pressure-tight housing, the relative distances between each lens of an array and the corresponding cell can thus advantageously be adjusted simultaneously with a single pressure-adjusting means, which could be integrated, e.g., as a component of a tracker on which the CPV modules or the array is arranged. The CPV modules can be built individually and their respective housings can be connected, e.g., tube-connected, or the modules can be integrated into a common housing built in one piece.

Preferably, the distance between each lens and the corresponding photovoltaic cell in each photovoltaic module of the array can be adjusted such that at least one distance is equal to the focal distance of the corresponding lens or such that the energy conversion efficiency of at least one module of the plurality of modules comprised in the array, in particular, the energy conversion efficiency of the whole array, is maximized. Thus, the energy output of an array comprising a plurality of CPV modules can advantageously be maximized at least for one particular module, e.g., a CPV module arranged in the center of the array, or any other module of the array, or even for the whole array.

The object of the invention is also achieved with a method for improving the energy conversion efficiency of a photovoltaic concentrator module. The inventive method comprises the step of adjusting the distance between the lens and the photovoltaic cell of the module such that the photovoltaic cell is in focus with respect to its lens.

Since the distance between the lens and the cell of a CPV module is subject to variations due, in particular, to temperature changes and/or consequent changes in the refractive indexes of the lens and/or the air, the inventive method has the advantage of keeping the cell at or at least close to the effective focal distance of the lens for a given temperature. When correcting chromatic aberrations, the inventive method can advantageously adjust the distance so that the cell remains at the average effective focal distance for the wavelength range triggering an optimal response of the module. Thus, temperature and/or spectral variations can be compensated such that the efficiency of the CPV module is optimized.

According to a preferred variant, the distance between the lens and the photovoltaic cell of the module can be adjusted by varying pressure. Pressure changes in a pressure-tight main housing of a CPV module, or in any other pressure-tight housing affecting the position of the cell on the optical axis of the corresponding lens, can be used to adjust the relative distance between a lens and its corresponding cell. Thus, the module geometry, in particular, its height, more in particular, the distance between a lens and a corresponding CPV cell, can be actively adjusted by increasing or decreasing the pressure inside the module.

Advantageously, the inventive method can further comprise the step of monitoring at least one temperature, and the pressure inside a pressure-tight housing of the module can be increased in comparison to the pressure outside the module, in particular, if the temperature increases, and the pressure inside the pressure-tight housing of the module can be decreased in comparison to the pressure outside the module, in particular, if the temperature decreases. With lenses made of polymeric materials, e.g., common Fresnel lenses, the focal length increases or decreases with the temperature. Thus, monitoring the ambient temperature and/or the temperature of the lens material and/or the temperature inside the CPV module can be advantageous for the optimization of energy output of the module. For example, when using a pressure-tight main housing with a lens and a CPV cell arranged on or in opposing surfaces thereof, the relative distance can be kept equal to the effective focal distance by increasing the pressure inside the main housing when the temperature increases, or by decreasing the pressure when the temperature decreases. When using a subhousing or secondary housing arranged underneath the cell, if the relative distance between the cell and lens needs to be shortened due to a lower temperature, a higher pressure can be applied to or in the secondary housing in order to "push" the cell toward the lens. Furthermore, a higher temperature can be compensated by applying a lower pressure in the secondary housing if the cell needs to be "pulled" away from the lens in order to match an increase in the focal length thereof.

Advantageously, the inventive method can further comprise the step of measuring the energy conversion efficiency of the module, and the distance can be adjusted such that the energy conversion efficiency is at least equal or superior to a predetermined value, in particular, using a feedback algorithm. A direct input on the conversion efficiency of the module is useful for adjusting the relative distance of the lens and the cell. The inventive method can thus be used in combination with efficiency monitoring. Electrical output variables of the system can be monitored, e.g., at the tracker level or at a separate control unit, such that information on the efficiency is retrieved and used as an input for the distance adjustment step. In particular, the efficiency can be compared to a predetermined value such as a fixed desired efficiency based on the known performance of a CPV module or a CPV array, and the distance between a lens and a corresponding cell can be increased or decreased when a drop in efficiency is noted. Alternatively, the predetermined value of the efficiency can be a local maximum obtained by periodically scanning a range of pressure. A feedback algorithm can be used in order to cycle the step of measuring the efficiency and adjusting the distance accordingly, such that the efficiency is optimal.

Thus, the inventive CPV module, the inventive CPV array, and the inventive method for adjusting the distance between a solar cell and the corresponding lens have the advantage of reducing the dependency of the energy output of a module on the ambient temperature and/or on spectral variations of the incident light. In particular, undesired changes in the focal length of lenses composed of polymeric materials can be at least partially compensated. The lens to cell distance can be actively controlled, in particular, by varying the pressure inside a pressure-tight housing, in particular, using dry air in order to avoid potential internal condensation in or on components of the module. The use of flexible materials for the module can allow for compensating large focal length variations, thereby improving the energy conversion efficiency of the system over broad temperature ranges.

BRIEF DESCRIPTION OF THE DRAWINGS

The invention will be described in more detail in the following, based on advantageous embodiments described in combination with the following figures.

DETAILED DESCRIPTION

Figure 1A:
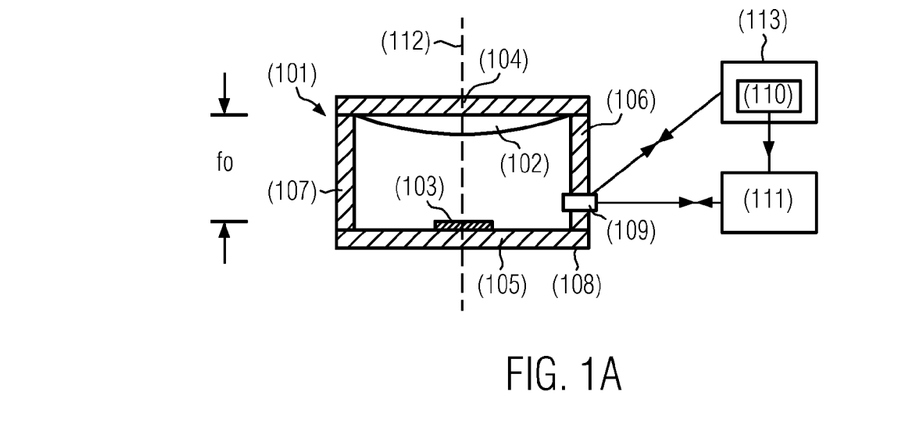
FIG. 1A is a cross-sectional view that schematically illustrates a concentrated photovoltaic module in a first embodiment of the invention.

FIG. 1A schematically represents in cross-section a first embodiment of a concentrated photovoltaic (CPV) module according to a first variant of the invention. The CPV module 101 comprises at least one lens 102 and at least one photovoltaic cell 103 facing each other and arranged on the respective surface of a lens plate 104 and a receiver plate 105. The lens plate 104 and the receiver plate 105 are joined by side walls 106, 107 and form a pressure-tight housing 108, in particular, a pressurized environment for the inner module parts. In particular, the pressure-tight housing 108 isolates at least the cell 103 and/or the lens 102 toward the environment, protecting it, e.g., from dust and humidity.

Figure 1B:
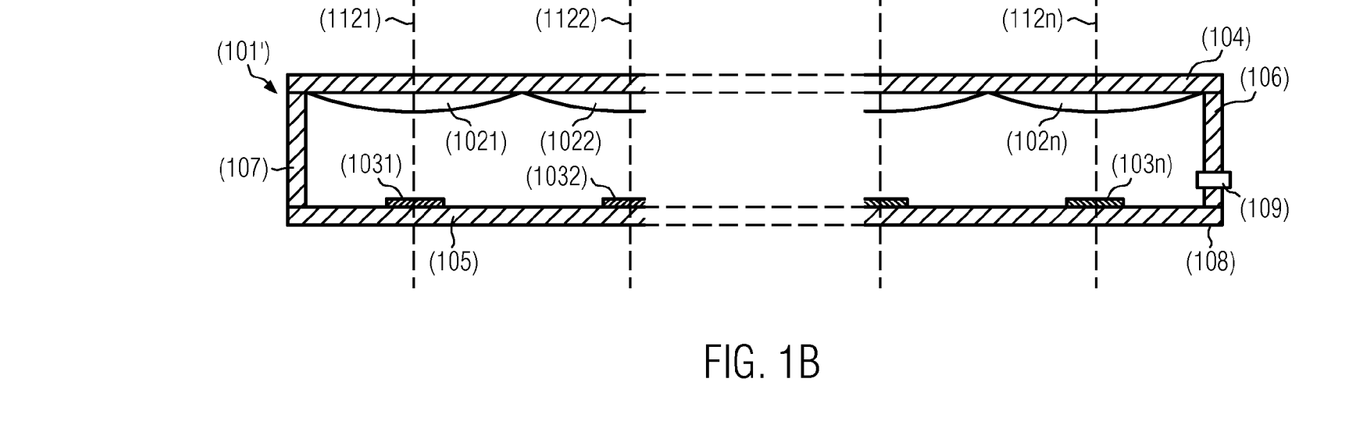
FIG. 1B is a cross-sectional view that schematically illustrates a concentrated photovoltaic module in a variant of the first embodiment of the invention.

FIG. 1B schematically represents in cross-section a variant of the first embodiment of a CPV module, wherein the inventive CPV module 101' comprises a plurality of cells 1031, 1032, . . . , 103n, up to 50, or even up to 100 or even more, and corresponding lenses 1021, 1022, . . . , 102n arranged in the form of an array. This alternative embodiment will be described after the first embodiment. Nevertheless, depending on the variant of the preferred embodiment, a single lens plate 104 can carry one lens, like in the first embodiment illustrated in FIG. 1A, or a plurality of lenses, even in the range of 50 to 100 lenses or more, like in the variant of the first embodiment illustrated in FIG. 1B.

The first embodiment as illustrated in FIG. 1A comprises a module 101 comprising one lens 102 and one corresponding photovoltaic cell 103. In the first embodiment, the lens 102 is a Fresnel lens made, e.g., of a polymeric material, but other lens types that can be adapted for CPV modules are also suitable. The CPV cell 103 is provided such that its center is aligned on the optical axis 112 of the lens 102. Under predetermined conditions, e.g., laboratory reference conditions, the cell 103 is at the focal distance $f_0$ with respect to the lens 102, such that a maximum of incident light passing through the lens 102 is focused on the cell 103 to optimize the energy conversion efficiency. Furthermore, the CPV cell 103 can be arranged on a heat dissipating means such as a heat sink, which is not represented here, and which can be provided on or comprised in the receiver plate 105.

The side walls 106, 107, and/or the lens plate 104, and/or the receiver plate 105 of the pressure-tight housing 108 can be made of or comprise metallic materials, and/or plastic or polymeric materials, and/or glass, and/or acrylic, and/or PLEXIGLAS®, or the like, and do not need to be all made of the same material. In particular, at least some of the materials composing the housing 108 can be flexible materials, knowing that most of the materials above show at least some degree of inherent elasticity that can be used to support the material function described herein.

The pressure-tight housing 108 further comprises a valve 109 that can be opened or closed in order to increase or decrease the pressure inside the housing 108. The valve 109 is arranged, e.g., on one of the side walls 106 of the housing 108 and linked to a pressure-varying means 111, e.g., a pump, which can increase the pressure, e.g., by supplying compressed dry air or another gas or fluid to the housing 108, or which can reduce the pressure, e.g., by sucking air from the housing 108. Instead of a pump, any other suitable pressure-varying means, like a compressed air distributing line, can be used to vary the pressure inside the housing 108.

According to a variant, a pressure-sensing means (not shown) may be provided to measure the pressure inside the housing 108.

Preferably, the pressure-varying means 111 provides compressed dry air or a dry inert gas or fluid and releases it periodically in order to avoid possible condensation inside the module housing 108. When the valve 109 is closed, the housing 108 is not subject to active pressure variations.

By varying the pressure inside the housing, it becomes possible to adjust the distance between the CPV cell 103 and the lens 102 so that the distance between both elements can be kept at the focal distance $f_0$ even under changing conditions. The pressure-varying means 111 thus has the role of the distance adjustment means according to the invention.

According to a variant of the first embodiment, the module 101 can further comprise a temperature sensor 110 forming part of a control unit 113 configured to determine the ambient temperature and/or the temperature of the housing 108 or the lens 102. In particular, the temperature sensor 110 is configured to monitor temperature variations in and/or outside the module 101. The control unit 113, receives and analyzes data from the temperature sensor 110, and can control the status of the valve 109 and or the pressure-varying means 111 to adjust the pressure inside the module 101 as a function of temperature. The temperature sensor 110 here is illustrated as forming part of the control unit 113. However, it could also be a separate unit or it can be integrated in the control unit 113.

In this case, the focal distance $f_0$ of the lens 102 can be calibrated as a function of temperature before and/or after mounting the lens on the module 101 and before and/or after installing the module 101 on site. As an alternative or in complement to this calibration, known relations between the refractive index of the lens material and the temperature can be used to establish the relation between focal distance $f_0$ and temperature. The calibration can be chosen such that at ambient temperature of, e.g., about 20° C. to 25° C., or at any other initial reference temperature, the cell 103 is mounted at an average focal distance value of the lens 102 corresponding to the wavelength range, which optimizes the energy conversion efficiency of the solar cell 103.

According to a variant, depending on the thermal properties of the material chosen for the lens 102, the control unit 113 can be configured to take into consideration only temperature variations detected by the sensor 110, which are above a certain threshold value below which the variation of the refractive index and/or the volume of the lens 102 are not considered to be significant because they will not result in a significant drop in the efficiency of the module 101.

The average distance between the lens 102 and the cell 103, and/or the flexibility of the housing 108, can be calibrated as a function of air pressure inside the housing 108 and/or temperature, such that no additional distance sensor is required. However, a distance sensing means can also be adapted, e.g., to monitor the relative distance between the cell 103 and the lens 102 at any moment.

Thus, when the CPV module 101 according to the first embodiment is on site, the control unit 113 analyzes the data obtained from the temperature sensor 110. In the first embodiment, when the control unit 113 determines that a temperature variation, positive or negative, is above the threshold, it can control the valve 109 to adjust the pressure inside the pressure-tight main housing 108 of the module 101 accordingly.

For example, a significant increase in temperature can result in a larger focal distance of the lens 102. Thus, the distance between the lens 102 and the cell 103 must be increased to match the new focal distance and optimize the energy conversion efficiency of the module 101. In the first embodiment, upon receiving a signal from the temperature sensor 110 interpreted as a significant increase in temperature, the control unit 113 can send an instruction to open the valve 109 and provide compressed dry air in order to increase the pressure inside the pressurized environment of the housing 108. Since at least some of the materials composing the housing 108 are chosen with some flexibility, the distance between the lens 102 and the cell 103 is consequently increased until the new focal distance is reached and the energy conversion efficiency is optimized.

Likewise, a significant drop in temperature can result in a shorter focal distance of the lens 102. Thus, the distance between the lens 102 and the cell 103 must be decreased accordingly in order to match the new focal distance and optimize the energy conversion efficiency of the CPV module 101. In the first embodiment, upon receiving a signal from the temperature sensor 110 interpreted as a significant drop in temperature, the control unit 113 can send an instruction to open the valve 109 and decrease the pressure inside the pressurized environment of the housing 108 by pumping dry air from it. Since at least some of the materials composing the housing 108 are chosen with some flexibility, the distance between the lens 102 and the cell 103 is consequently decreased until the new focal distance is reached and the energy conversion efficiency is optimized.

Instead of measuring the temperature using a temperature sensor 110, the control unit 113 can also be configured to adjust the pressure by analyzing the energy conversion efficiency of the module 101. By scanning through a predetermined pressure range, a local and/or absolute maximum concerning the energy conversion efficiency can be found using a feedback loop mechanism. In this case, no additional temperature sensor is necessary.

Eventually, temperature sensing and energy conversion efficiency optimization can be combined.

FIG. 1B illustrates a variant of the first embodiment, in which a CPV module 101' comprises a plurality of CPV cells 1031, 1032, . . . , 103n, which can be of the order of up to 50, or even 100 or more, and corresponding lenses 1021, 1022, . . . , 102n arranged in the form of an array. Reference numbers are the same as in FIG. 1A for similar components and for components playing similar roles. In this variant of the first embodiment, a single lens plate 104 holds the plurality of lenses 1021, 1022, . . . , 102n, and a single receiver plate 105 holds the CPV cells 1031, 1032, . . . , 103n, which are arranged on the respective optical axes 1121, 1122, . . . , 112n of their corresponding lens 1021, 1022, . . . , 102n, such that under predetermined conditions, for example, laboratory conditions, the center of each cell 1031, 1032, . . . , 103n is at the focal point of its respective lens 1021, 1022, . . . , 102n, in order to optimize the energy conversion efficiency.

In FIG. 1B, only one row of cells 1031, 1032, . . . , 103n and corresponding lenses 1021, 1022, . . . , 102n is illustrated. However, the module 101' can comprise a plurality of lenses and cells arranged over a plurality of rows and a plurality of columns, in the form of an array, for example, a square or a rectangular array of lenses and respective cells, wherein the lenses and cells, respectively, still share a common lens plate 104 and a common receiver plate 105. Thus, a single pressure-tight housing 108 can be used even when a plurality of cells and lenses are used for a single module 101'.

The main difference between the embodiment illustrated in FIG. 1A and the variant of FIG. 1B is, thus, the plurality of cells 1031, 1032, . . . , 103n and associated lenses 1021, 1022, . . . , 102n. All other components and options described for the first embodiment and illustrated in FIG. 1A are the same, or are available as well for this variant. It is, therefore, referred back to FIG. 1A and the description above. In particular, although these components are not illustrated in FIG. 1B, this variant of the first embodiment can also comprise the pressure-varying means 111, the temperature sensor 110, and the control unit 113 in order to control the valve 109, like in the first embodiment illustrated in FIG. 1A.

In the variant of the first embodiment as illustrated in FIG. 1B, the pressure inside the housing 108 is changed in order to increase or decrease the distance between each cell 1031, 1032, . . . , 103n and its associated lens 1021, 1022, . . . , 102n. This distance can be adjusted in order to keep the overall efficiency of all the cells optimized, or alternatively, the distance could be adjusted such that a particular cell among the plurality of cells 1031, 1032, . . . , 103n keeps an optimized conversion efficiency.

Figure 2:
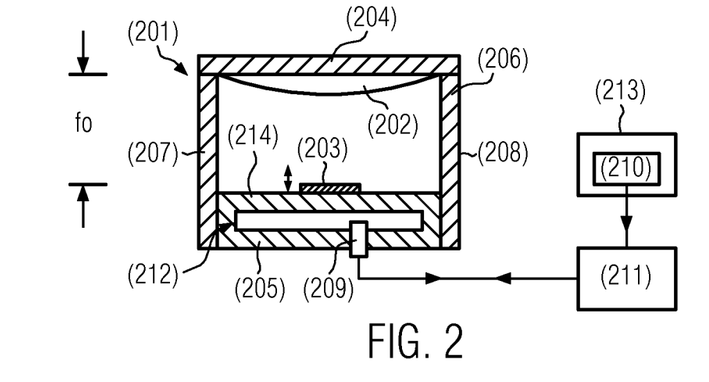
FIG. 2 is a cross-sectional view that schematically illustrates a concentrated photovoltaic module in a second embodiment of the invention.

FIG. 2 schematically represents in cross-section a second embodiment of a concentrated photovoltaic (CPV) module according to a second variant of the invention. Like in the first embodiment, the CPV module 201 comprises a lens 202 and a photovoltaic cell 203 facing each other and arranged on or in the respective surface of a lens plate 204 and a receiver plate 205. The lens plate 204 and the receiver plate 205 are joined by side walls 206, 207 and form a protective housing 208 toward the environment for the inner module components.

The lens 202, the CPV cell 203, and the materials used for the side walls 206, 207, and/or the lens plate 204, and/or the receiver plate 205, are similar to those of the first embodiment illustrated in FIG. 1A. It is, therefore, referred back to the description above. Similarly to the first embodiment, the cell 203 can be arranged on a heat-dissipating means such as a heat sink (not represented in FIG. 2), which can be provided on or comprised in the receiver plate 205 on which the cell 203 is arranged.

As further illustrated in FIG. 2, in the second embodiment, the receiver plate 205 underneath the CPV cell 203 forms a pressurized housing 212 with a valve 209 arranged on one of its free side walls. Like in the first embodiment, the valve 209 is connected to a pressure-varying means 211, like a pump, to increase or reduce the pressure inside the housing 212. This can be achieved by, e.g., supplying compressed air to, or pumping air from, the pressure-tight housing in the receiver plate 205, like in the first embodiment.

At least a part of the upper region 214 of the housing 212 on which the CPV cell 203 is arranged is made of a flexible material.

By varying the pressure inside the housing 212, it becomes possible to adjust the distance between the CPV cell 203 and the lens 202 so that the distance between both elements can be kept at the focal distance $f_0$, even under changing conditions. When increasing the pressure inside housing 212, the CPV cell 203 moves toward the lens 202; when decreasing the pressure, the CPV cell 203 moves away from the lens 202.

Since the pressure-tight housing 212 of the receiver plate 205 is not connected to the tight environment of the main housing 208 protecting the cell 203 and the lens 202, the fluid supplied or removed by the pressure-varying means 211 does not have to satisfy the same requirements as a condensation onto the optics, or the cell cannot occur.

According to a variant of the second embodiment, the CPV module 201 as illustrated in FIG. 2 may further comprises a temperature sensor 210 in a control unit 213 configured like the sensor 110 and the control unit 113 of the first embodiment. It is, therefore, referred back to the description of these features in the first embodiment.

Similar to the first embodiment, a calibration of the focal distance of the lens 202 against temperature can be realized in the second embodiment, and the control unit 213 can be configured to act only when temperature variations that exceed a threshold related to the energy conversion efficiency of the CPV module 201 are detected. Likewise, the average distance between the lens 202 and the CPV cell 203, and/or the flexibility of the secondary housing in the receiver plate 205, can be calibrated as a function of the air pressure in order to avoid using additional distance-sensing means, but this step is not mandatory to achieve the invention if a distance-sensing means is used to monitor the distance between the lens 202 and the cell 203.

In the second embodiment, upon receiving a signal from the temperature sensor 210 interpreted as a significant increase in temperature above the efficiency-related threshold, the control unit 213 can send an instruction to open the valve 209 and pump air from the pressurized environment of the receiver plate 205 in order to decrease the pressure therein. Since the receiver plate 205 is at least composed of a flexible material, it will contract, such that the distance between the cell 203 and the lens 203 is increased, until it matches the larger focal distance of the lens 202 resulting from the increase in temperature, thus optimizing the efficiency of the module 201 for the new higher temperature.

Furthermore, upon receiving a signal from the temperature sensor 210 interpreted as a significant drop in temperature, the control unit 213 can send an instruction to open the valve 209 and provide compressed air into the pressurized housing of the receiver plate 205, such that the pressure therein is increased. Thus, the housing of the receiver plate 205 will expand, pushing the cell 203 toward the lens 202 and thereby decreasing their relative distance, such that the new shorter focal length resulting from the lower temperature is matched and the energy efficiency conversion of the CPV module 201 is optimized.

Like in the first embodiment, the optimization can also be based on searching a local or absolute maximum in the energy conversion efficiency without sensing the temperature. This can be achieved by varying the pressure in a predetermined range and sensing the energy conversion efficiency. Using a feedback loop, the local or absolute maximum can be achieved.

Like in the first embodiment, the energy conversion efficiency optimization can be combined with temperature sensing.

The first and second embodiments of the invention could be combined to form a further variant according to the invention.

Figure 3:
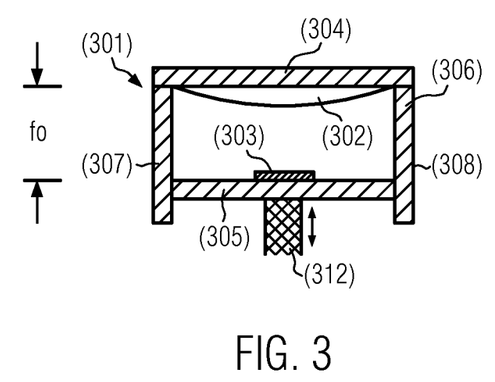
FIG. 3 is a cross-sectional view that schematically illustrates a concentrated photovoltaic module in a third embodiment of the invention.

FIG. 3 schematically represents in cross-section a third embodiment of a concentrated photovoltaic (CPV) module according to a third variant of the invention. Like in the first embodiment, the CPV module 301 comprises a lens 302 and a photovoltaic cell 303 facing each other and arranged on or in the respective surface of a lens plate 304 and a receiver plate 305. The lens plate 304 and the receiver plate 305 are joined by side walls 306, 307 and form a protective housing 308 toward the environment for the inner module components.

In contrast to the first and second embodiments, the distance between the lens 302 and the photovoltaic cell 303 is adjusted using a mechanical distance adjustment means 312 that can move the photovoltaic cell 303 up and down. The mechanical distance adjustment means 312 can be a piezoelectric actuator or a purely mechanical actuator, or the like. In further embodiments of the invention, the active distance adjustment could be replaced or complemented by a passive adjustment using, for example, bimetal structures, a thermal expansion of a gas-filled cavity, or a construction using thermal expansion of polymeric or other solid materials. Instead of moving the photovoltaic cell 303, the lens 302 could be moved relative to the cell 303. According to a further variant, both the cell 303 and the lens 302 could be moved by a distance adjustment means 312.

Like in the first embodiments, the third embodiment also allows the adjustment of the distance between the photovoltaic cell 303 and the lens 302 to keep both at focal distance $f_0$.

Figure 4:
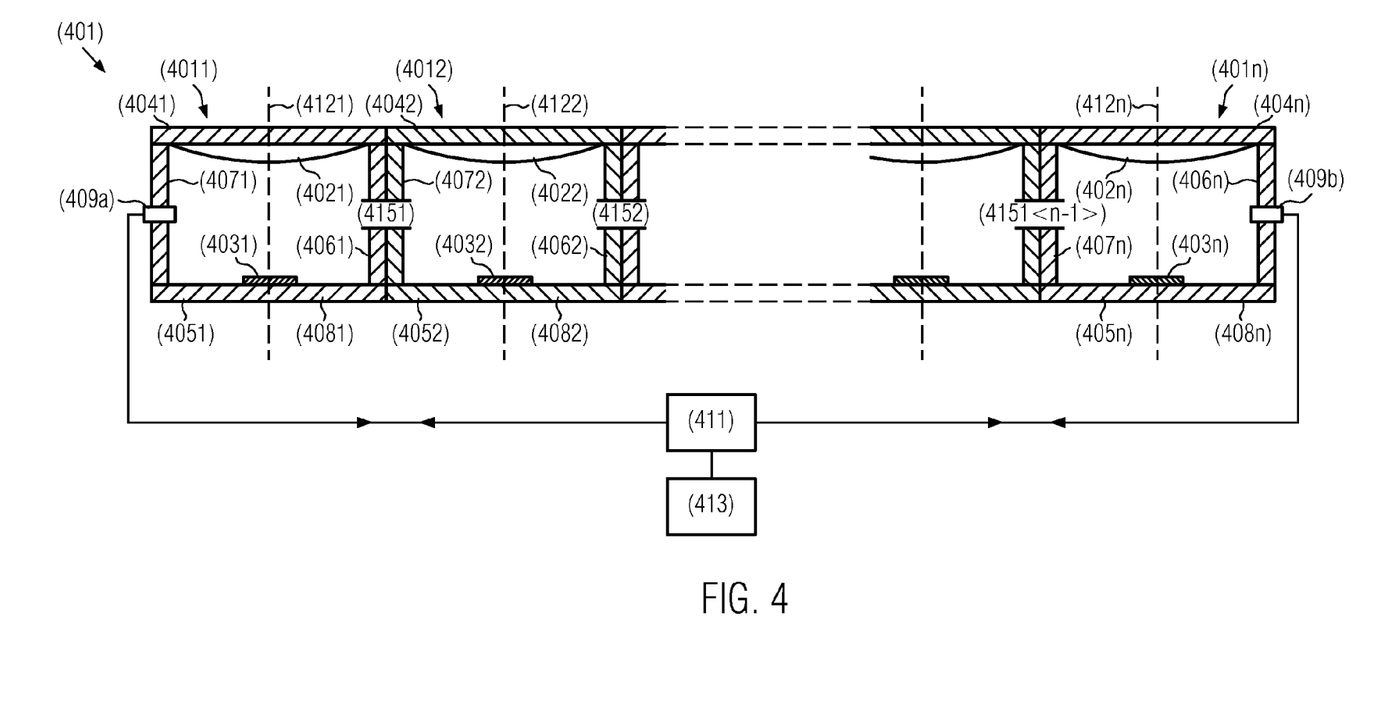
FIG. 4 is a cross-sectional view that schematically illustrates a concentrated photovoltaic array in a fourth embodiment of the invention.

FIG. 4 schematically represents in cross-section a fourth embodiment of the invention and illustrates a concentrated photovoltaic (CPV) array according to a further variant of the invention.

The array 401 combines a plurality of CPV modules 4011, 4012, ..., 401n, the number of which depends on the desired size and geometry of the array 401. The modules 4011, 4012, ..., 401n can be combined linearly in a one-dimensional array, or in a two-dimensional array, e.g., in square- or rectangular-shaped array. A plurality of arrays can also be combined to obtain an even larger array. 4012, ..., 401n of the fourth embodiment is similar to a CPV module 101 of the first embodiment as illustrated in FIG. 1A, and is thus represented with one lens and one corresponding CPV cell. However, in a variant of the fourth embodiment, each module 4011, 4012, ..., 401n can also be a module comprising a plurality of lenses and respective CPV cells, like the module 101' of the variant of the first embodiment illustrated in FIG. 1B.

In the fourth embodiment as illustrated in FIG. 4, the array 401 is a linear sequence of n CPV modules 4011, 4012, ..., 401n, each one comprising at least one lens 4021, 4022, ..., 402n and at least one photovoltaic cell 4031, 4032, ..., 403n facing each other and arranged on a respective lens plate 4041, 4042, ..., 404n and a respective receiver plate 4051, 4052, ..., 405n. Each module 4011, 4012, ..., 401n is separated from its neighbor module by side walls 4061, 4062, ..., 406n and 4071, 4072, ..., 407n, at least one of the side walls 4071, 406n of the array 401 being provided with at least one valve (in this variant two) 409a, 409b connected to a pressure-varying means 411, e.g., an air pump, to adjust the pressure inside. In a way similar to the first embodiment, the structure of the array 401 forms a succession of pressure-tight housings 4081, 4082, ..., 408n, which are tightly connected to each other by tubes 4151, 4152, ..., 415(n-1), thereby forming a common pressurized housing for all CPV modules 4011, 4012, ..., 401n composing the array 401, isolating the CPV cells 4031, 4032, ..., 403n from the environment.

The lenses 4021, 4022, ..., 402n, CPV cells 4031, 4032, ..., 403n, and the materials used for the side walls 4061, 4062, ..., 406n, 4071, 4072, ..., 407n, the lens plates 4041, 4042, ..., 404n and the receiver plates 4051, 4052, ..., 405n, share the characteristics of the first embodiment illustrated in FIG. 1A and/or its variant illustrated in FIG. 1B. It is, therefore, referred back to the description above. In particular, at least some of the materials composing the housings 4081, 4082, ..., 408n can be flexible materials. Heat-dissipating means such as heat sinks can be adapted to the individual CPV modules 4011, 4012, ..., 401n of the array 401, and/or be comprised in the structure forming the receiver plates 4051, 4052, ..., 405n.

In the fourth embodiment, the CPV array 401 further comprises a control unit 413 configured to control the pressure-varying means 411 and the at least one valve 409a, 409b to thereby adjust the air pressure inside the main housing. The control unit 413 is further configured to receive and/or analyze electrical output values from at least one module 4011, 4012, ..., 401n of the array 401, in particular, all modules 4011, 4012, ..., 401n of the array 401, and determine at least one individual energy conversion efficiency and/or the energy conversion efficiency of the whole array 401. The control unit 413 can be mounted or comprised, e.g., in a tracking unit system (not represented in FIG. 4) on which the array 401 is arranged.

According to the fourth embodiment of the invention, the control unit 413 can control the at least one valve 409a, 409b and the pressure varying means 411 such that, starting from an initial pressure inside the housing and due to the at least partial flexibility of the pressure-tight housing, a local or absolute maximum of the energy conversion efficiency of at least one module 4011, 4012, ..., 401n of the array 401 or of the whole array 401 can be achieved by applying an optimized pressure inside the main housing of the array 401 to reach an optimized efficiency. The optimized pressure can be identified during a scan during which the pressure inside the housing is varied in a predetermined range.

In the fourth embodiment, the scan can be performed periodically and/or when the control unit 411 detects that the at least one individual efficiency and/or the average energy conversion efficiency of the whole array 401 is below a predetermined threshold. A feedback algorithm can then be used to find local or absolute maximum of the energy conversion efficiency. Thus, the efficiency of at least one module 4011, 4012, ..., 401n of the array 401, in particular, the efficiency of the whole array 401, can be optimized periodically or automatically every time a drop in efficiency is detected.

The CPV array 401 of the fourth embodiment can be complemented by at least one temperature sensor configured, e.g., like in the first embodiment, in order to accelerate the positioning of the CPV cells 4031, 4032, ..., 403n relatively to the lenses 4021, 4022, ..., 402n. Thus, the efficiency feedback loop of the fourth embodiment could be used as a complementary distance adjustment means for fine tuning a distance adjustment based on temperature as described above. According to possible variants, a plurality of sensors can be used, for example, one for each module composing the array, but it is also possible, and preferred, to use only one central sensor for controlling the complete system.

Figure 5:
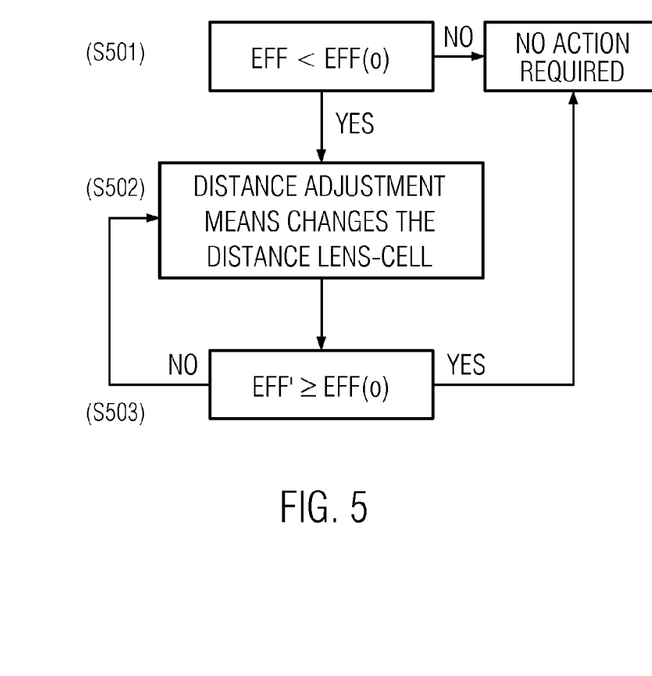
FIG. 5 is a functional block diagram illustrating the general concept of the inventive method in a fifth embodiment.

FIG. 5 is a functional block diagram describing the principle of the inventive method in a fifth embodiment. The process described in the fifth embodiment illustrated by FIG. 5 can be used for a CPV module such as described in the previous embodiments, comprising at least one lens, at least one photovoltaic cell, and a distance adjustment means.

At the first step of the process S501, the energy conversion efficiency, Eff, of the CPV module is compared to an initial value, $Eff_0$. The initial value can be a predetermined value, e.g., an efficiency threshold determined during a calibration of the CPV module energy conversion efficiency, or, for example, the efficiency determined at the moment of installing the CPV module on site. In the fifth embodiment, the initial value, $Eff_0$, is a threshold below which the CPV module is considered not to work optimally and/or to be out of focus. In the first step S501 of the fifth embodiment, when the energy conversion efficiency of the CPV module is at least equal or superior to the threshold, $Eff \geq Eff_0$, the photovoltaic cell of the CPV module is considered to be at the average focal point of the lens, and no further action is taken until the next efficiency value is determined.

However, if an efficiency drop is noted such that the efficiency becomes lower than the threshold, $Eff < Eff_0$, the fifth embodiment comprises a second step S502, wherein the distance adjustment means adjusts the distance between the CPV cell and the lens.

In the next step S503 of the fifth embodiment, if the new efficiency, Eff', determined after the distance adjustment is at least equal or superior to the threshold, $Eff' \geq Eff_0$, then no further action is required and/or the distance between the lens and the cell is considered to be the average focal distance of the lens. However, if the new efficiency is still below the threshold, $Eff' < Eff_0$, the next step is a loop back to the second step of the fifth embodiment S502, such that a new distance adjustment is made.

Figure 6:
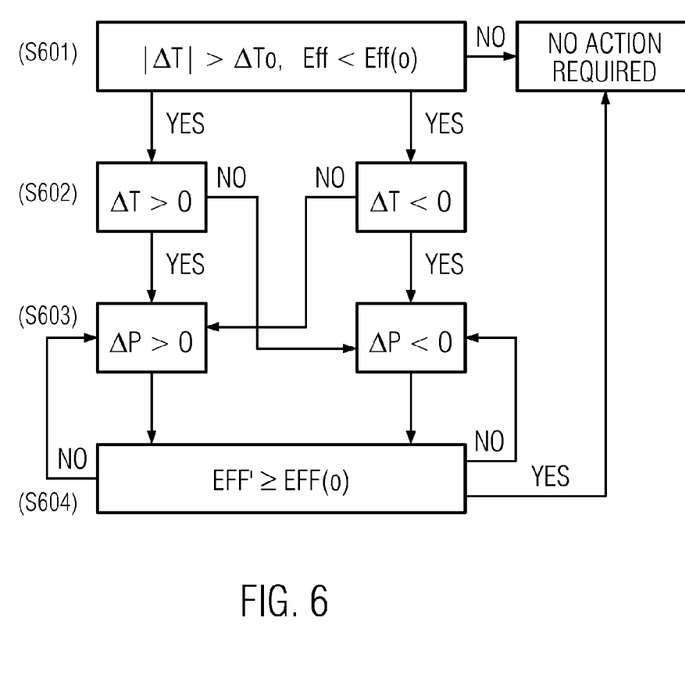
FIG. 6 is a functional block diagram illustrating the inventive method in a sixth embodiment, wherein the pressure inside the main housing of a CPV module changes as a function of temperature.

FIG. 6 is a functional block diagram describing the principle of the inventive method in a sixth embodiment, wherein the pressure inside the main housing of a CPV module can change as a function of temperature. The sixth embodiment of the invention describes a method that could be applied to a CPV module 101 according to the first embodiment. Thus, reference numerals are also given in relation to FIG. 1A, but it is understood that the method according to the sixth embodiment is not limited to a CPV module 101 according to the first embodiment. In particular, the method according to the sixth embodiment could be applied to any CPV module 101 comprising a pressure-tight and at least partially flexible housing 108 and a distance adjustment means configured to adjust the distance between the lens 102 and the cell 103 of the CPV module 101 by varying pressure. The method described in the sixth embodiment could, e.g., be used in combination with the temperature sensor 110 and the control unit 113 of the first embodiment.

At the first step S601 of the process of the sixth embodiment, temperature variations between a first and second temperature, $\Delta T = T_2 - T_1$, are monitored, e.g., outside and/or inside the main housing 108 and/or on the lens 102 itself. Depending on the lens material, a predetermined threshold of temperature, $\Delta T_0$, can be considered, such that if the temperature variations exceed the threshold, $|\Delta T| > \Delta T_0$, the module 101 is considered not to yield an optimal energy conversion efficiency because the temperature changes affect the lens material, changing its refractive index and defocusing the system. This step can be combined with a direct monitoring of the efficiency, Eff, like in the fifth embodiment. Thus, if the temperature variations do not exceed the threshold, $|\Delta T| \leq \Delta T_0$, which translates into the energy conversion efficiency being at least equal or superior to a predetermined threshold, $Eff \geq Eff_0$, the pressure inside the housing 108 of the CPV module 101 is considered to be such that the photovoltaic cell 103 is at the average focal point of the lens 102, and no further action is required until a new temperature determination is performed, as the energy conversion efficiency, Eff, of the module 101 is considered to be optimized.

If the temperature variations are above the threshold, $|\Delta T| > \Delta T_0$, for which the efficiency of the CPV module is considered to drop below its threshold, $Eff < Eff_0$, the sixth embodiment further comprises a second step S602 of evaluating the temperature variation. Since the focal length of the lens 102 varies with the temperature, the second step S602 can comprise determining whether the second temperature is lower than the first temperature, $\Delta T<0$. Alternatively, or in complement, the second step S602 of the sixth embodiment can also comprise determining whether the second temperature is higher than the first temperature, $\Delta T>0$.

In the third step of the sixth embodiment S603, if the second step S602 has determined that the temperature has increased, $\Delta T>0$, the distance adjustment means is configured to increase the pressure inside the pressure-tight and at least partially flexible housing, $\Delta P>0$, such that the distance between the lens 102 and the cell 103 increases. Alternatively, if the second step S602 has determined that the temperature has decreased, $\Delta T<0$, the distance adjustment means is configured to decrease the pressure, $\Delta P<0$, inside the pressurized housing 108 of the CPV module 101.

The sixth embodiment further comprises a fourth step S604, wherein the new energy conversion efficiency, Eff', of the CPV module 101 is determined after the change of pressure, $\Delta P$, inside the module. If the efficiency is still below the acceptance threshold, Eff'<$Eff_0$, the sixth embodiment comprises a loop back to the previous step S603, such that a further adjustment in pressure is performed. If the new efficiency is at least equal or superior to the threshold, Eff'$\geq Eff_0$, it is considered to have been optimized, and the distance between the lens 102 and the cell 103 is considered to match the average focal distance of the lens 102.

Figure 7:
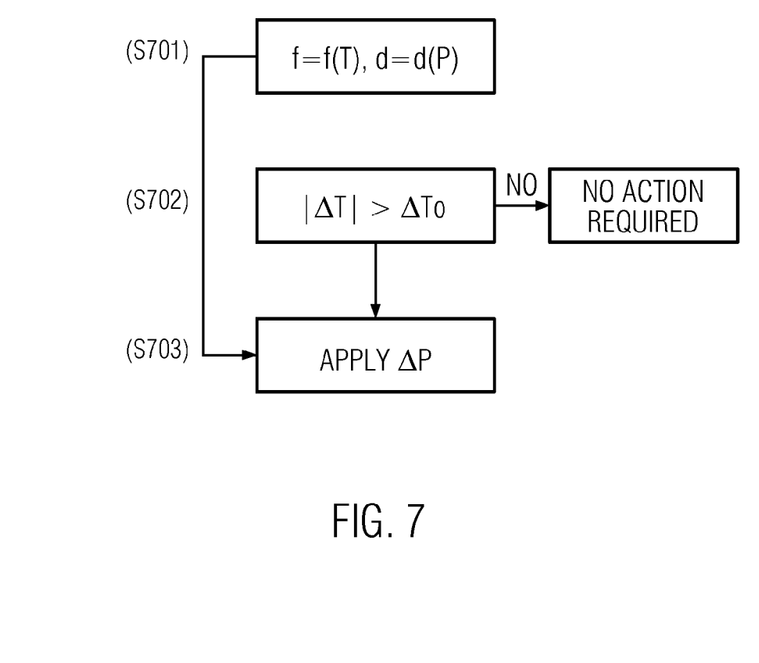
FIG. 7 is a functional block diagram illustrating the inventive method in a seventh embodiment, wherein the pressure inside the main housing of a CPV module changes as a function of temperature using a calibration.

FIG. 7 is a functional block diagram describing the principle of the inventive method in a seventh embodiment, wherein the pressure inside the main housing of a CPV module can change as a function of temperature using a calibration. The method according to the seventh embodiment could be applied to a CPV module 101, 201 according to, e.g., the first or the second embodiment. Reference numerals of these two embodiments are thus added in the description of the seventh embodiment, but it is understood that the method described hereafter can be applied to other variants and embodiments of CPV modules and arrays according to the invention.

The first step S701 of the seventh embodiment of the invention comprises realizing a calibration of the focal distance of the lens 102, 202 as a function of temperature, f=f(T) using, e.g., known properties of the material used for fabricating the lens 102, 202. The first step S701 also comprises realizing a calibration of the distance between the CPV cell 103, 203 and the lens 102, 202 as a function of air pressure inside a pressure-tight housing 108, 208 of the CPV module 101, 201, d=d(P), once the CPV module 101, 201 has been assembled.

Similar to the first step S601 of the sixth embodiment, the second step S702 of the seventh embodiment comprises monitoring temperature variations, $\Delta T$, and comparing them to a temperature threshold, $\Delta T_0$. In a variant of the seventh embodiment, this step could also be accompanied by a complementary energy efficiency monitoring, e.g., like in the fifth or sixth embodiment. In the seventh embodiment, if no variation above a predetermined temperature threshold is detected, $|\Delta T| \leq \Delta T_0$, in the second step S702, no further action is required until the next temperature determination is performed, as the system is considered to be optimized: the efficiency can be considered to be at least equal or superior to a desired threshold, and the cell 103, 203 is considered to be at the average focal distance of the lens 102, 202.

In the third step S703 of the seventh embodiment, if the second step S702 has determined that the temperature variation was significant, $|\Delta T| > \Delta T_0$, the efficiency of the CPV module 101, 201 can no longer be considered to be optimal, and the focal distance of the lens 102, 202 is considered to have been modified by the significant temperature variation.

Thus, in the third step S703 of the seventh embodiment, the distance adjustment means is configured to use the calibration, f=f(T) and d=d(P), realized at the first step S701 in order to adjust the distance between the lens 102, 202 and the cell 103, 203 by varying pressure, $\Delta P$, so that the cell 103, 203 is placed at the modified average focal distance of the lens 102, 202. Once the new focal distance is reached according to the calibration, the CPV module 101, 201 is considered to have optimized its energy conversion efficiency, and no further action is required until the next temperature measurement.

Figure 8:
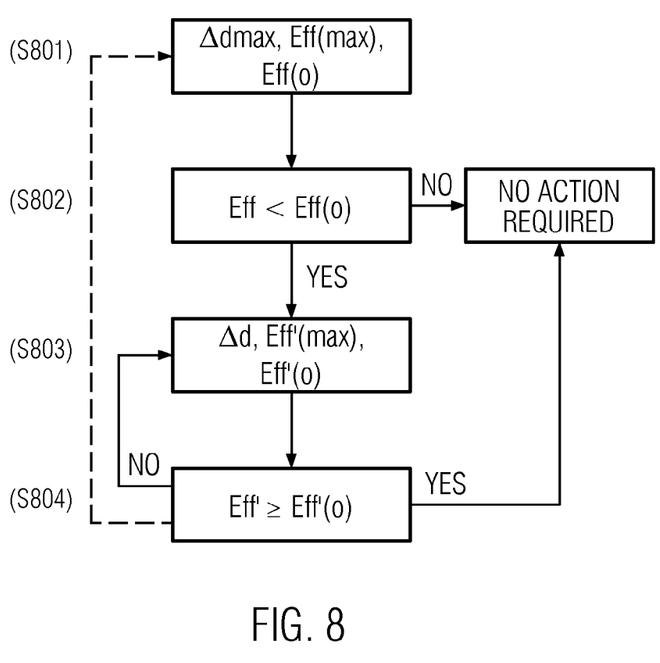
FIG. 8 is a functional block diagram illustrating the inventive method in an eighth embodiment, wherein the pressure inside the main housing of a CPV module is adjusted with a feedback loop based on conversion efficiency.

FIG. 8 is a functional block diagram describing the principle of the inventive method in an eighth embodiment, wherein the pressure inside the main housing of a CPV module is adjusted with a feedback loop based on conversion efficiency. This method could be applied, e.g., to a CPV array 401 comprising a plurality of CPV modules 4011, 4012, . . . , 401n according to the fourth embodiment of the invention. However, it is understood that the method according to the eighth embodiment can also be applied to other realizations of the inventive CPV modules and/or arrays according to other variants and/or other combinations of the embodiments described above.

The first step S801 of the method according to the eighth embodiment comprises scanning the entire range of distances, $\Delta d_{max}$, available between at least one lens 4021, 4022, . . . , 402n and a corresponding photovoltaic cell 4031, 4032, . . . , 403n, and determining the local maximum of the energy conversion efficiency, $Eff_{max}$, of at least one CPV module 4011, 4012, . . . , 401n. Based on this determination, the first step S801 further comprises determining a threshold, $Eff_0$, below which the system is considered not to be working optimally. In the eighth embodiment, this step is performed periodically. In a variant, it could be performed on fixed dates, but not necessarily periodically.

The eighth embodiment further comprises a second step S802 of monitoring the energy conversion efficiency, Eff, of the at least one module 4011, 4012, . . . , 401n, and comparing it to the threshold determined in the first step S801. If the efficiency is at least equal or superior to the threshold, Eff$\geq Eff_0$, then no further action is required, as the system is considered to be working optimally.

However, if the efficiency is below the threshold, Eff<$Eff_0$, then the method according to the eighth embodiment comprises a third step S803 in which the distance adjustment means is configured to scan a range of distances, $\Delta d$, determine the distance corresponding to a new local maximum of energy conversion efficiency, $Eff'_{max}$, and adjusts the distance of the at least one lens 4021, 4022, . . . , 402n and corresponding cell 4031, 4032, . . . , 403n to this new value. This step further comprises determining a new threshold, $Eff'_0$, based on the determined local maximum, $Eff'_{max}$.

The fourth step S804 of the eighth embodiment comprises monitoring the efficiency, Eff', after the distance adjustment, and comparing it to the threshold, $Eff'_0$. Again, if the efficiency remains at least equal or superior to the threshold, Eff'$\geq Eff'_0$, no action is required. But if the efficiency drops, Eff'<$Eff'_0$, then the loop goes back to the third step S803. When the period is reached for a scan of the entire range of distances, $\Delta d_{max}$, the loop goes back to the first step S801 instead. Thus, the feedback on the energy conversion efficiency of the at least one CPV module 4011, 4012, . . . , 401n is used for adjusting the distance and optimizing the electrical output of the system.

Thus, the invention improves the module performance against temperature and/or spectral variations by providing a means for adjusting the distance between lens and cell, e.g., by varying the pressure inside the housing. Furthermore, the embodiments and their various variants and combinations can efficiently improve the energy conversion efficiency of a concentrated photovoltaic system such as a CPV module or a CPV array comprising a plurality of CPV modules.

The invention claimed is:

1. A photovoltaic concentrator module, comprising:
a pressure-tight main housing;
at least one lens;
at least one photovoltaic cell; and
a distance adjustment device configured to adjust a distance between the at least one lens and the at least one photovoltaic cell by operating at least one valve to vary the pressure inside the main housing.

2. The photovoltaic concentrator module according to claim 1, wherein the distance adjustment device is configured to adjust the distance such that the at least one photovoltaic cell is in focus with respect to the at least one photovoltaic cell.

3. The photovoltaic concentrator module according to claim 2, wherein the at least one lens and the at least one photovoltaic cell are arranged on or in opposing surfaces of the pressure-tight main housing.

4. The photovoltaic concentrator module according to claim 3, wherein at least one of the lens and the main housing comprises a flexible material.

5. The photovoltaic concentrator module according to claim 3, further comprising a temperature sensing device, and wherein the distance adjustment device is further configured to adjust a pressure inside the main housing as a function of a temperature sensed by the temperature-sensing device.

6. The photovoltaic concentrator module according to claim 2, wherein the at least one lens and the at least one photovoltaic cell are arranged on or in opposing surfaces of a pressure-tight main housing.

7. The photovoltaic concentrator module according to claim 2, further comprising a device configured for determining an energy conversion efficiency of the photovoltaic concentrator module, and wherein the distance adjustment device is further configured to adjust the distance such that the energy conversion efficiency of the photovoltaic concentrator module is at least equal to or higher than a predetermined value.

8. The photovoltaic concentrator module according to claim 1, further comprising a device configured for determining an energy conversion efficiency of the photovoltaic concentrator module, and wherein the distance adjustment device is further configured to adjust the distance such that the energy conversion efficiency of the photovoltaic concentrator module is at least equal to or higher than a predetermined value.

9. A photovoltaic concentrator array comprising a plurality of photovoltaic concentrator modules according to claim 1.

10. The photovoltaic concentrator array according to claim 9, wherein two or more photovoltaic concentrator modules of the plurality share the same pressure-tight housing.

11. The photovoltaic concentrator array according to claim 9, wherein the distance between each lens and the corresponding photovoltaic cell in each photovoltaic module of the array is adjusted such that at least one distance is equal to a focal distance of the corresponding lens or such that an energy conversion efficiency of at least one module of the plurality of modules comprised in the array is maximized.

12. The photovoltaic concentrator module according to claim 1, wherein the distance adjustment device comprises a control device configured to generate control signals associated with the at least one valve.

13. The photovoltaic concentrator module according to claim 1, wherein the distance adjustment device comprises at least one pump configured to supply or remove fluid through the at least one valve.

14. A method for improving the energy conversion efficiency of a photovoltaic concentrator module, comprising a step of adjusting a distance between a lens and a photovoltaic cell of the photovoltaic concentrator module such that the photovoltaic cell is in focus with respect to the lens by actively pressurizing or depressurizing a region between the lens and the photovoltaic cell, further comprising a step of monitoring at least one temperature, and wherein the pressure inside a pressure-tight housing of the photovoltaic concentrator module is increased if the temperature increases, and the pressure inside the pressure-tight housing of the module is decreased if the temperature decreases.

15. The method according to claim 14, further comprising a step of measuring the energy conversion efficiency of the photovoltaic concentrator module, and wherein the distance is adjusted such that the energy conversion efficiency is at least equal to or above a predetermined value.

16. A photovoltaic concentrator module, comprising:
a pressure-tight main housing with at least one adjustable surface;
at least one lens;
at least one photovoltaic cell; and
a distance adjustment device configured to adjust a distance between the at least one lens and the at least one photovoltaic cell by actuating the at least one adjustable surface of the pressure-tight main housing, wherein actuating the at least one adjustable surface comprises deforming the at least one surface.

17. The photovoltaic concentrator module according to claim 16, wherein actuating the at least one adjustable surface comprises moving the surface relative to at last one other surface of the pressure-tight main housing.

18. A photovoltaic concentrator module comprising:
a pressure-tight main housing with at least one adjustable surface;
at least one lens;
at least one photovoltaic cell; and
a distance adjustment device configured to adjust a distance between the at least one lens and the at least one photovoltaic cell by actuating the at least one adjustable surface of the pressure-tight main housing, wherein the at least one photovoltaic cell is arranged on or in a surface of a pressure-tight secondary housing provided underneath the cell, and wherein actuating the at least one adjustable surface comprises varying the pressure inside the secondary housing.

19. The photovoltaic concentrator module according to claim 18, wherein the main housing and secondary housing have a common wall.

20. A photovoltaic concentrator module comprising:
a pressure-tight main housing with at least one adjustable surface;
at least one lens;
at least one photovoltaic cell; and
a distance adjustment device configured to adjust a distance between the at least one lens and the at least one photovoltaic cell by actuating the at least one adjustable surface of the pressure-tight main housing, wherein the at least one photovoltaic cell is arranged on or in a surface of a pressure-tight secondary housing provided underneath the cell, wherein the secondary housing comprises a flexible material, and further comprising a temperature sensing device, and wherein the distance adjustment device is further configured to adjust a pressure inside the secondary housing as a function of a temperature sensed by the temperature-sensing device.

* * * * *

UNITED STATES PATENT AND TRADEMARK OFFICE
CERTIFICATE OF CORRECTION

PATENT NO. : 9,680,043 B2  
APPLICATION NO. : 14/390341  
DATED : June 13, 2017  
INVENTOR(S) : Eckart Gerster, Jakob Stor and Johannes Wullner It is certified that error appears in the above-identified patent and that said Letters Patent is hereby corrected as shown below:

On the Title Page  
In ITEM (72) Inventors: change "Jacob Stor" to --Jakob Stor--

In the Specification  
Column 12, Line 28, change "larger array."  
to --larger array. For illustrative and clarity purposes, in FIG. 4, each module 4011,--

Signed and Sealed this  
Twenty-third Day of January, 2018

Joseph Matal  
*Performing the Functions and Duties of the*  
*Under Secretary of Commerce for Intellectual Property and*  
*Director of the United States Patent and Trademark Office*